United States Patent
You et al.

(10) Patent No.: US 11,913,133 B2
(45) Date of Patent: Feb. 27, 2024

(54) METHOD OF MANUFACTURING POLYCRYSTALLINE SILICON INGOT USING A CRUCIBLE IN WHICH AN OXYGEN EXHAUST PASSAGE IS FORMED BY SINGLE CRYSTAL OR POLYCRYSTALLINE RODS

(71) Applicant: Lintech Corporation, Gyeonggi-do (KR)

(72) Inventors: Ho Jung You, Incheon (KR); Dong Nam Shin, Gyeonggi-do (KR); Sei Kwang Oh, Gyeonggi-do (KR); Jun Seok Lee, Seoul (KR); Sun Bin Yum, Gyeonggi-do (KR); Tae-Woo Kang, Gyeonggi-do (KR)

(73) Assignee: Lintech Corporation, Hwaseong-si (KR)

( * ) Notice: Subject to any disclaimer, the term of this patent is extended or adjusted under 35 U.S.C. 154(b) by 0 days.

(21) Appl. No.: 17/858,776

(22) Filed: Jul. 6, 2022

(65) Prior Publication Data
US 2023/0059953 A1   Feb. 23, 2023

(30) Foreign Application Priority Data

Aug. 18, 2021   (KR) .......................... 10-2021-0108831

(51) Int. Cl.
*C30B 15/10* (2006.01)
*C30B 11/00* (2006.01)
(Continued)

(52) U.S. Cl.
CPC ............ *C30B 11/002* (2013.01); *C30B 15/10* (2013.01); *C30B 15/34* (2013.01); *C30B 17/00* (2013.01); *C30B 29/06* (2013.01)

(58) Field of Classification Search
CPC ....... C30B 29/06; C30B 17/00; C30B 11/002; C30B 15/10; C30B 15/34
See application file for complete search history.

(56) References Cited

U.S. PATENT DOCUMENTS 9,388,507 B2   7/2016   Tsuzukihashi et al.
2002/0108557 A1*   8/2002   Wood ..................... C30B 15/02
117/911
(Continued)

FOREIGN PATENT DOCUMENTS

| JP | 4747267 | * | 5/2011 |
| KR | 10-2012-0135284 A | | 12/2012 |
| WO | WO-2016/124509 A1 | | 8/2016 |

*Primary Examiner* — Robert M Kunemund
(74) *Attorney, Agent, or Firm* — Blank Rome LLP

(57) ABSTRACT

The present invention relates to a method of manufacturing polycrystalline silicon ingot using a crucible in which an oxygen exhaust passage is formed by single crystal or polycrystalline rods, the method including the steps of: manufacturing the single crystal or polycrystalline silicon rods each having the shape of a quadrilateral pillar; putting the single crystal or polycrystalline quadrilateral pillar-shaped silicon rods into the crucible in such a manner as to be arranged close to one another along the inner peripheral surface of the crucible to thus form a space portion inside the single crystal or polycrystalline silicon rods, into which silicon chunks are put, and the oxygen exhaust passages between the inner peripheral surface of the crucible and the respective surfaces of the single crystal or polycrystalline silicon rods oriented toward the inner peripheral surface of the crucible; putting the silicon chunks into the space portion of the crucible; and melting and crystallizing the silicon chunks.

1 Claim, 11 Drawing Sheets

(51) Int. Cl.
*C30B 15/34* (2006.01)
*C30B 17/00* (2006.01)
*C30B 29/06* (2006.01)

(56) References Cited

U.S. PATENT DOCUMENTS

| | | | | |
|---|---|---|---|---|
| 2003/0089302 A1* | 5/2003 | Hartmann | ............... | C30B 15/02 |
| | | | | 117/13 |
| 2010/0162946 A1* | 7/2010 | Bender | ................... | C30B 15/22 |
| | | | | 117/202 |
| 2010/0219380 A1* | 9/2010 | Hertlein | ............... | C01B 33/035 |
| | | | | 252/500 |
| 2016/0348271 A1* | 12/2016 | Ravi | ...................... | C30B 29/06 |

* cited by examiner

PRIOR ART

PRIOR ART

METHOD OF MANUFACTURING POLYCRYSTALLINE SILICON INGOT USING A CRUCIBLE IN WHICH AN OXYGEN EXHAUST PASSAGE IS FORMED BY SINGLE CRYSTAL OR POLYCRYSTALLINE RODS

BACKGROUND OF THE INVENTION

Cross Reference to Related Application of the Invention

The present application claims the benefit of Korean Patent Application No. 10-2021-0108831 filed in the Korean Intellectual Property Office on Aug. 18, 2021, the entire contents of which are incorporated herein by reference.

FIELD OF THE INVENTION

The present invention relates to a method of manufacturing polycrystalline silicon ingot using a crucible in which an oxygen exhaust passage is formed by single crystal or polycrystalline rods.

BACKGROUND OF THE RELATED ART

Generally, a polycrystalline silicon ingot is used as a material of a solar wafer.

In specific, the polycrystalline silicon ingot is sliced to a given thickness to manufacture a polycrystalline silicon wafer, and then, the polycrystalline silicon wafer is machined to make the solar wafer.

A process of manufacturing the polycrystalline silicon ingot is one of the important processes of producing a semiconductor device such as the solar wafer.

If a silicon melt is stored in a silica crucible, oxygen generated from the silica as the material of the crucible is mixedly introduced into the silicon melt, and further, oxygen in the silicon melt is exhausted as SiO gas from the surface of the silicon melt.

When solidification is started, oxygen is mixedly introduced from the bottom and side of the crucible, and accordingly, the amount of oxygen in the silicon melt at the time of the solidification becomes increased. Further, the amount of oxygen on the bottom of the crucible as a portion where the solidification is started becomes increased.

If the solidification on the bottom of the crucible is started to raise a solid-liquid interface, oxygen is mixedly introduced only from the side of the crucible, and accordingly, the amount of oxygen mixedly introduced into the silicon melt becomes slowly decreased.

As impurities such as oxygen, and the like generated from the silicon melt or mixedly introduced from the crucible are emitted to the outer surface of the ingot in the process of the polycrystalline silicon crystallization, the ingot may be partially broken or concave air bubble exhaust grooves with various sizes may be formed on the surface of the ingot.

As a result, an available area of the ingot is reduced, thereby causing a low wafer production yield and a bad ingot production efficiency.

To minimize the partial breakage of the ingot and the formation of the concave air bubble exhaust grooves with various sizes on the surface of the ingot, a method for manufacturing a polycrystalline silicon ingot through a silicon nitride ($Si_3N_4$) coating layer and a silica (SiO) multi-layered coating structure is disclosed in Korean Patent Application Laid-open No. 10-2012-0135284.

Hereinafter, the method for manufacturing a polycrystalline silicon ingot as disclosed in Korean Patent Application Laid-open No. 10-2012-0135284 will be schematically explained.

First, a polycrystalline silicon ingot manufacturing apparatus used for manufacturing a polycrystalline silicon ingot as disclosed in Korean Patent Application Laid-open No. 10-2012-0135284 is configured as follows.

As shown in FIG. 1, a polycrystalline silicon ingot manufacturing apparatus 10 includes a crucible 20 for storing a silicon melt L, a chill plate 12 for mounting the crucible 20, an underside heater 13 for supporting the underside of the chill plate 12, and a ceiling heater 14 located above the crucible 20.

Further, a heat insulating material 15 is located around the crucible 20.

The chill plate 12 has a hollow structure and is configured to be supplied with argon (Ar) gas through a supply pipe 16.

The crucible 20 has a square or circular horizontal sectional shape.

As shown in FIGS. 2 and 3, the crucible 20 has a body 21 made of silica, a $Si_3N_4$ coating layer 22 formed on the inner side peripheral wall of the body 21, and silica multi-layered coatings 27 formed on the bottom surface 20a of the body 21.

The $Si_3N_4$ coating layer 22 has a structure in which to 300 μm molten silica micro sand 26 is distributed to a mixture of 0.2 to 4.0 μm $Si_3N_4$ powder 24 and silica 25 containing 10 to 6000 ppm sodium.

Further, the mixture of the 0.2 to 4.0 μm $Si_3N_4$ powder 24 and the silica 25 containing 10 to 6000 ppm sodium is disposed (exposed) on the outermost surface of the $Si_3N_4$ coating layer 22.

The silica multi-layered coatings 27 have slurry layers 28 and stucco layers 29 laminated in turn on top of each other.

The silica multi-layered coatings 27 have the multi-layered structure in which the slurry layers 28 and the stucco layers 29 are laminated to three or four layers.

In this case, each slurry layer 28 is formed by coating the slurry obtained by mixing the fillers having particle size greater than 10 μm and less than 50 μm and aqueous dispersion liquid of colloidal silica with each other.

Further, each stucco layer 29 is formed by dispersing (applying) silica particles having particle sizes greater than 0.3 mm and less than 3 mm.

Referring to the method for manufacturing the polycrystalline silicon ingot using the polycrystalline silicon ingot manufacturing apparatus 10, first, a silicon raw material is put into the crucible 20 having the $Si_3N_4$ coating layer 22 formed on the inner side peripheral wall thereon and the silica multi-layered coatings 27 formed on the bottom surface thereof.

In this case, as the silicon raw material, massive type silicon chunks obtained by pulverizing high purity silicon having a purity of 11 N (99.999999999% purity)) are used.

For example, the massive type silicon chunks have particle sizes in the range of 30 to 100 mm.

The silicon raw material is heated by energizing the ceiling heater 14 and the underside heater 13.

As a result, the silicon melt L is stored in the crucible 20.

Next, the energization of the underside heater 13 is stopped, and Ar gas is supplied to the inside of the chill plate 12 through the supply pipe 16.

As a result, the bottom of the crucible 20 is cooled.

Further, the energization of the ceiling heater 14 is slowly reduced, and accordingly, the silicon melt L in the crucible 20 is first cooled on the bottom of the crucible 20 and then solidified in one direction from the bottom of the crucible 20 toward the top.

In this case, the amount of Ar gas supplied to the chill plate 12 and the amount of energization of the ceiling heater 14 are controlled to adjust a solidification velocity of the silicon melt L in the crucible 20, that is, an upward moving velocity of a solid-liquid interface of the silicon melt L.

The solidification process of the silicon melt L in the crucible 20 is divided into three areas as shown in FIG. 2, and the solidification velocities for the respective areas are set.

In more detail, the solidification process of the silicon melt L in the crucible 20 is divided into a first area A1 with a distance from 0 mm to a height X, a second area A2 with a distance from the height X to a height Y, and a third area A3 with a distance above the height Y, with respect to the bottom 20a of the crucible 20. In this case, the height X is in the range of 10 to 30 mm, and the height Y is in the range of 30 to 100 mm.

Further, the height Y-X of the second area A2 is in the range of 10 to 40 mm.

For example, if it is assumed that X is 20 mm and Y is 40 mm, the height Y-X of the second area A2 is 20 mm.

The solidification velocities for the respective areas are set as follows.

A solidification velocity V1 on the first area A1 is in the range of 10 to 20 mm/h.

A solidification velocity V2 on the second area A2 is in the range of 1 to 5 mm/h.

A solidification velocity V3 on the third area A3 is in the range of 5 to 30 mm/h.

Even though the polycrystalline silicon ingot is manufactured using the polycrystalline silicon ingot manufacturing apparatus 10 and method, however, impurities such as oxygen, and the like generated from the silicon melt or mixedly introduced from the crucible are emitted to the outer surface of the ingot in the process of the polycrystalline silicon crystallization, so that the ingot may be partially broken or the concave air bubble exhaust grooves with various sizes may be formed on the surface of the ingot.

SUMMARY OF THE INVENTION

Accordingly, the present invention has been made in view of the above-mentioned problems occurring in the related art, and it is an object of the present invention to provide a method of manufacturing polycrystalline silicon ingot using a crucible in which an oxygen exhaust passage is formed by single crystal or polycrystalline rods that is capable of minimizing the partial breakage of the ingot and the formation of concave air bubble exhaust grooves with various sizes on the surface of the ingot in the process of polycrystalline silicon crystallization, which are caused by the emission of impurities such as oxygen, and the like generated from a silicon melt or mixedly introduced from the crucible to the outer surface of the ingot.

To accomplish the above-mentioned objects, according to the present invention, there is provided a method of manufacturing polycrystalline silicon ingot using a crucible in which an oxygen exhaust passage is formed by single crystal or polycrystalline rods, the method including the steps of: manufacturing the single crystal or polycrystalline silicon rods each having the shape of a quadrilateral pillar; putting the single crystal or polycrystalline quadrilateral pillar-shaped silicon rods into the crucible in such a manner as to be arranged close to one another along the inner peripheral surface of the crucible to thus form a space portion inside the single crystal or polycrystalline silicon rods, into which silicon chunks are put, and the oxygen exhaust passages between the inner peripheral surface of the crucible and the respective surfaces of the single crystal or polycrystalline silicon rods oriented toward the inner peripheral surface of the crucible; putting the silicon chunks into the space portion of the crucible; and melting and crystallizing the silicon chunks.

According to the present invention, desirably, the single crystal or polycrystalline silicon rods may be ones selected from the pillars each having the shape of a trapezoid and the shape of a rectangular pillar with a concave one side.

According to the present invention, desirably, if the single crystal or polycrystalline silicon rods each have the shape of the trapezoidal pillar, the short side of the trapezoidal pillar may be oriented toward the inner peripheral surface of the crucible.

According to the present invention, desirably, if the single crystal or polycrystalline silicon rods each have the shape of the rectangular pillar with the concave one side, the concave portion of the rectangular pillar may be oriented toward the inner peripheral surface of the crucible.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE EMBODIMENTS

Hereinafter, embodiments of the present invention will be explained with reference to the attached drawings.

First, the polycrystalline silicon ingot manufacturing apparatus as disclosed in the conventional technologies may be utilized in the present invention.

Figure 1:
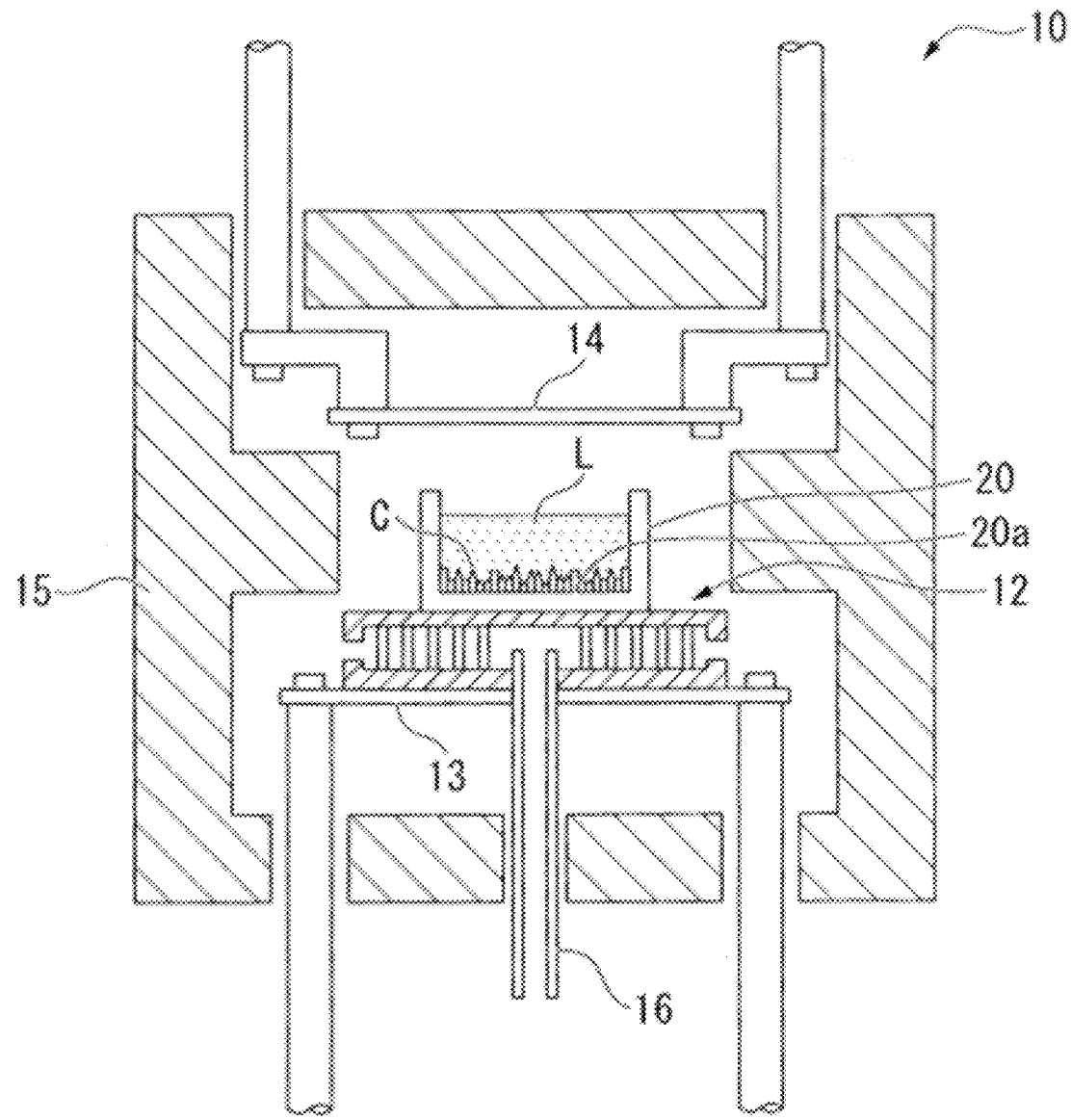
FIG. 1 is a sectional view showing an apparatus of manufacturing polycrystalline silicon ingot using a crucible in which an oxygen exhaust passage is formed by single crystal or polycrystalline rods according to the present invention.

That is, a manufacturing apparatus as shown in FIG. 1 may be used as a silicon ingot manufacturing apparatus for performing a method of manufacturing polycrystalline silicon ingot using a crucible in which an oxygen exhaust passage is formed by single crystal or polycrystalline rods according to the present invention.

As shown in FIG. 1, the silicon ingot manufacturing apparatus 10 for performing a method of manufacturing polycrystalline silicon ingot using a crucible in which an oxygen exhaust passage is formed by single crystal or polycrystalline rods according to the present invention includes the crucible 20 for storing the silicon melt L, the chill plate 12 for mounting the crucible 20, the underside heater 13 for supporting the underside of the chill plate 12, and the ceiling heater 14 located above the crucible 20.

Further, the heat insulating material 15 is located around the crucible 20.

The chill plate 12 has a hollow structure and is configured to be supplied with argon (Ar) gas through the supply pipe 16.

The crucible 20 has a square or circular horizontal sectional shape, and according to an embodiment of the present invention, the crucible 20 has the circular sectional shape.

Figure 2:
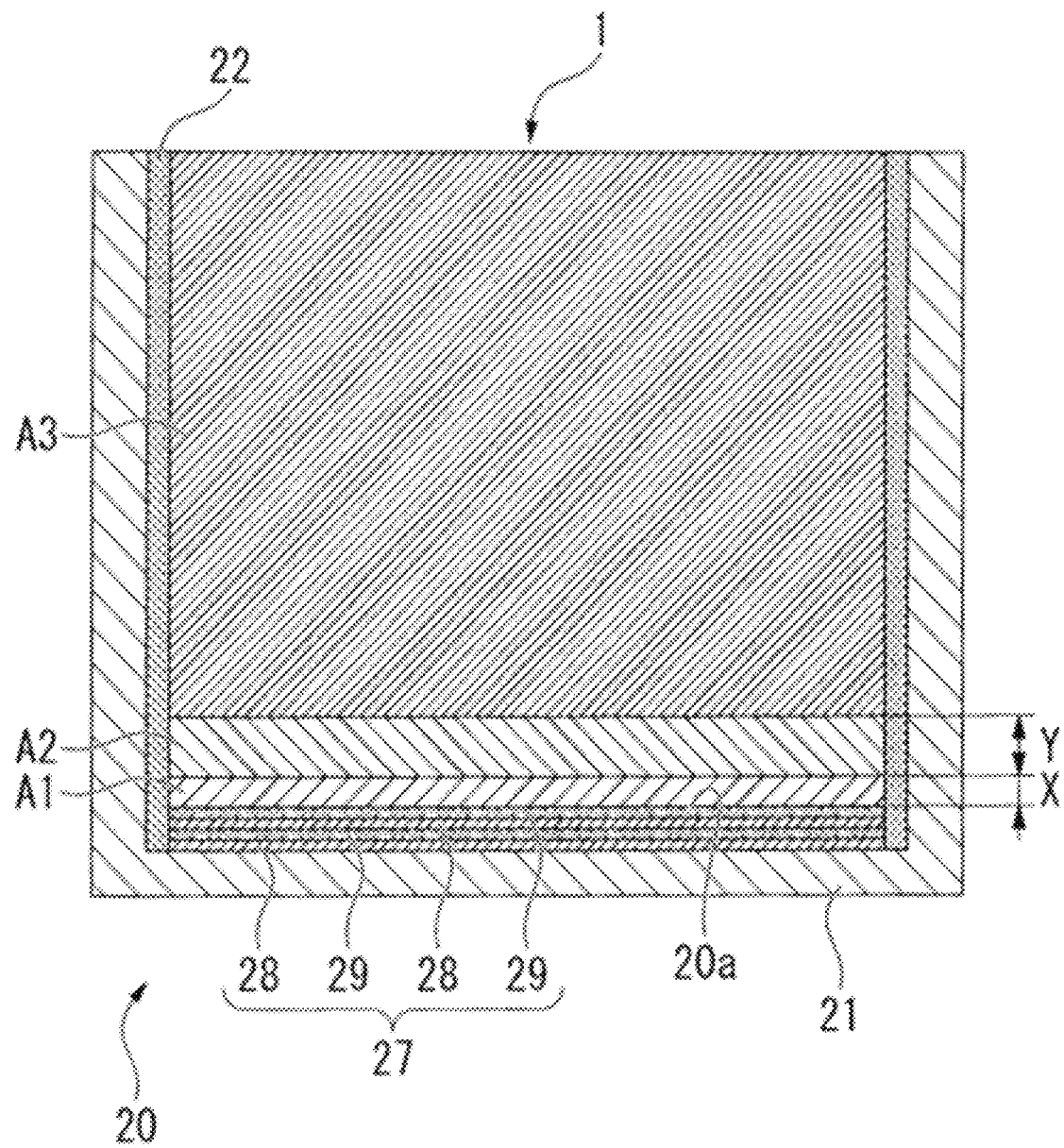
FIG. 2 is a sectional view showing a silicon solution solidification process that is divided into three areas in the crucible of the polycrystalline silicon ingot manufacturing apparatus of FIG. 1.
Figure 3:
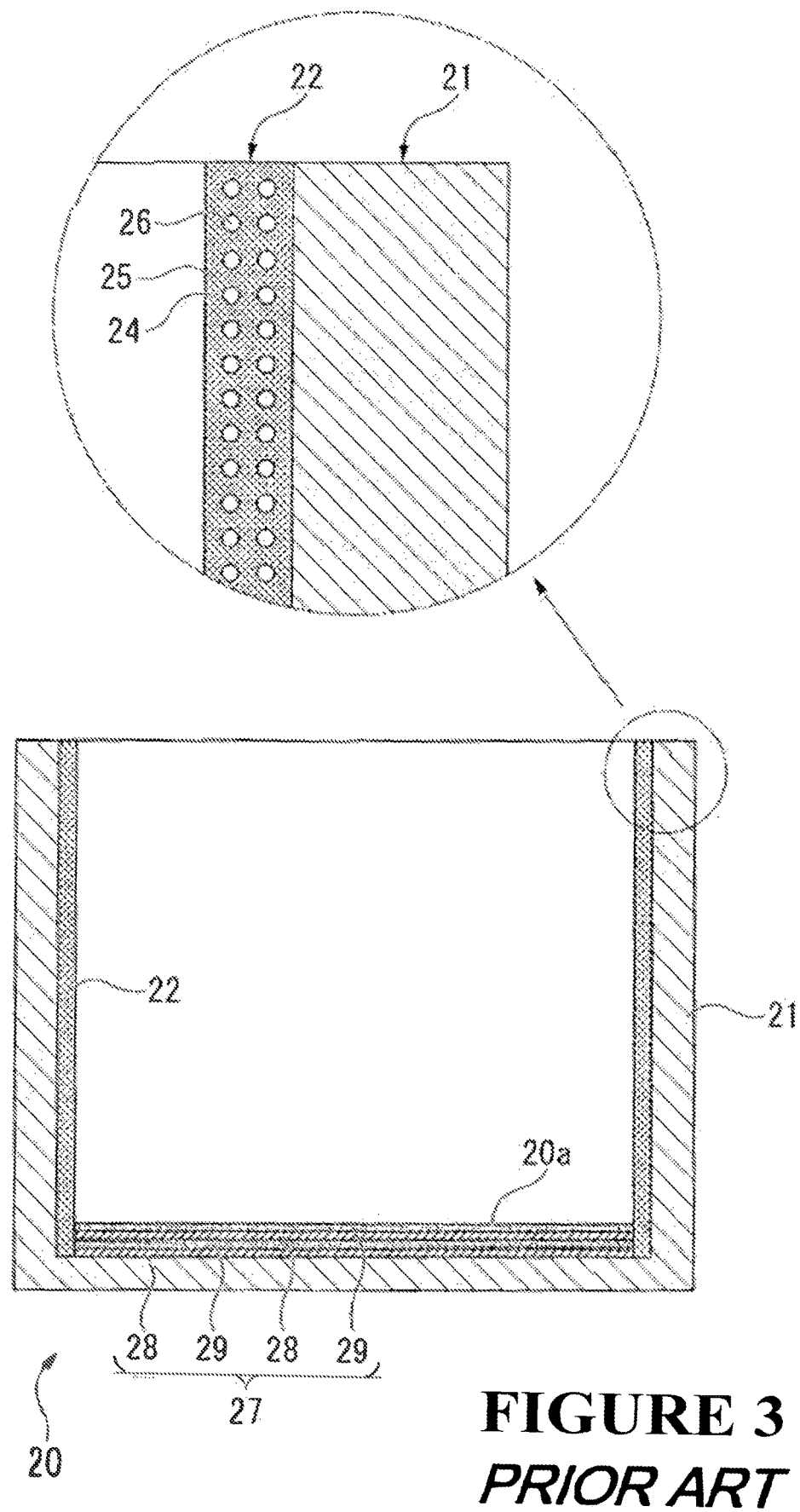
FIG. 3 is a schematic view showing the crucible of the polycrystalline silicon ingot manufacturing apparatus of FIG. 1.

As shown in FIG. 2, the crucible 20 has the body 21 made of silica, and after $SiN_4$ is coated on the inner side peripheral wall and the bottom surface 20a of the body 21, $SiO_2$ is then coated thereon. Otherwise, after $SiO_2$ is coated on the inner side peripheral wall and the bottom surface 20a of the body 21, $SiN_4$ is then coated thereon. Further, $SiO_2$ coating, $Y_2O_3$ coating, $ZrO_2$ coating, or the same coating as disclosed in Korean Patent Application Laid-open No. 10-2012-0135284 may be applied.

According to the present invention, the silicon ingot manufacturing apparatus 10 is configured to have the above-mentioned parts, which is just provided to allow the present invention to be easily understood, and therefore, various known or commercial silicon ingot manufacturing apparatuses may be adopted.

Hereinafter, the method of manufacturing polycrystalline silicon ingot using a crucible in which an oxygen exhaust passage is formed by single crystal or polycrystalline rods according to the present invention using the silicon ingot manufacturing apparatus 10 will be explained.

The crucible 20, which is used in the silicon ingot manufacturing apparatus 10, is made of silica SiO, and in a process of putting silicon (silicon chunks) to melt the silicon chunks through heating, accordingly, oxygen generated from the crucible and oxygen generated from the coating materials of the crucible are introduced into a silicon melt. Further, the introduced oxygen is exhausted to the outside through crystallization, thereby causing the breakage of the ingot or the formation of concave grooves on the surface of the ingot.

To solve such problems, the ingot manufacturing method according to the present invention includes the following steps.

First, a first step is carried out to make the quadrilateral silicon rods.

In specific, single crystal or polycrystalline silicon rods each having the shape of a trapezoidal pillar (See FIGS. 4D and 4E) or the shape of a rectangular pillar with a concave one side (See FIGS. 4A and 4C), which are located on the inner peripheral surface of the crucible 20 of the polycrystalline silicon ingot manufacturing apparatus 10, are machinedly provided.

For example, if the circular crucible 20 is provided, the machined quadrilateral pillar has the following size.

In the case of the single crystal or polycrystalline silicon rods each having the shape of the rectangular pillar with the concave one side (See FIGS. 4A and 4C), if it is assumed that an angle of the circular crucible 20 in a circumferential direction is 10°, that is, the circumference of the crucible 20 is 3600 mm, the rectangular pillar has the shape of an arch with a width of 100 mm, a thickness of 10 mm, and a center depth of the concave portion of 3 mm.

In the case of the single crystal or polycrystalline silicon rods each having the shape of the trapezoidal pillar (See FIGS. 4D and 4E), the silicon rod is machined to have a long side size of 100 mm, a short side size of 70 mm, and a thickness of 10 mm.

Further, a height of the quadrilateral pillar is less than or equal to that of the crucible 20.

However, the size of the quadrilateral pillar is just suggested for the explanation of the present invention, and therefore, it may be adjusted through the simple change of the design by the ordinary person in the art according to the size and shape of the crucible of the ingot manufacturing apparatus.

For the conveniences of the description, further, the silicon rod having the shape of the quadrilateral pillar is explained, but of course, it may change to any shape that is located on the side peripheral wall of the crucible to thus exhaust the oxygen generated during the melting of the silicon.

The quadrilateral pillar is manufactured using the know technologies in the art such as single crystal or polycrystalline ingot cutting or grinding.

A second step is carried out to put the quadrilateral-pillar shaped silicon rods into the crucible 20.

In specific, the single crystal or polycrystalline quadrilateral pillar-shaped silicon rods are arranged close to one another along the inner peripheral surface of the crucible 20, thereby forming a space portion inside the single crystal or polycrystalline silicon rods, into which the silicon chunks can be put.

Figure 4A:
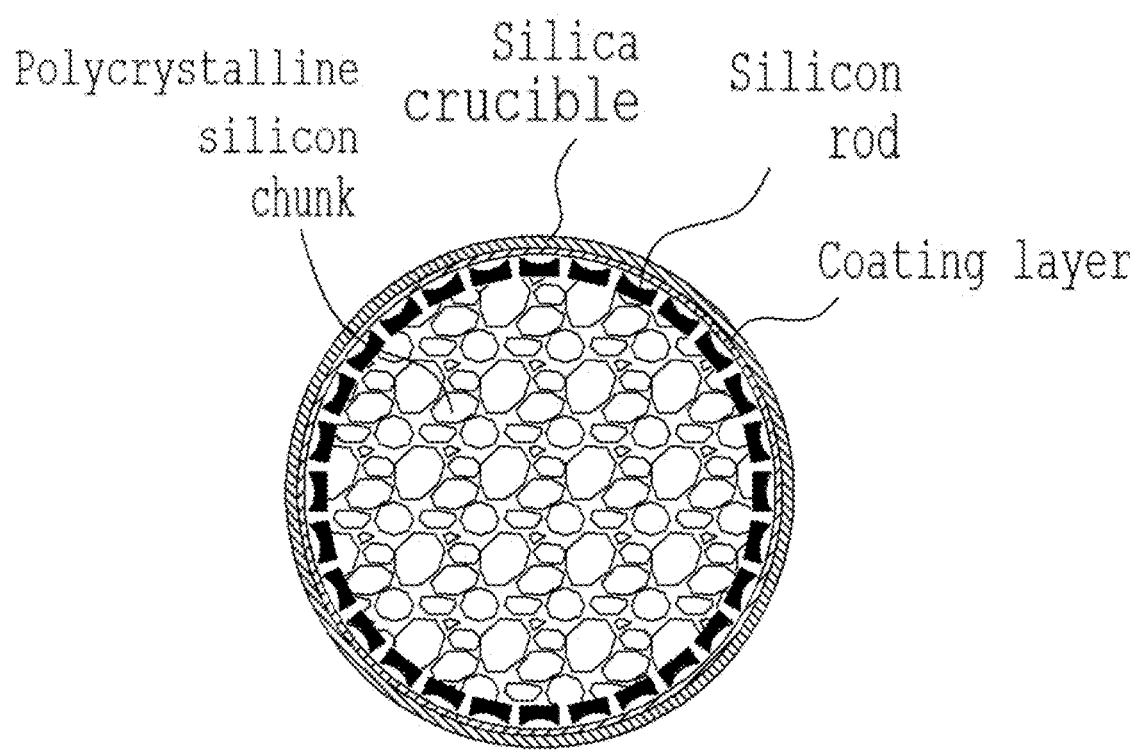
FIGS. 4A and 4B are cross sectional and longitudinal sectional views respectively showing a configuration where the single crystal or polycrystalline silicon rods each having the shape of a rectangular pillar with a concave one side are located on the inner peripheral surface of the crucible of the polycrystalline silicon ingot manufacturing apparatus according to the present invention.
Figure 4B:
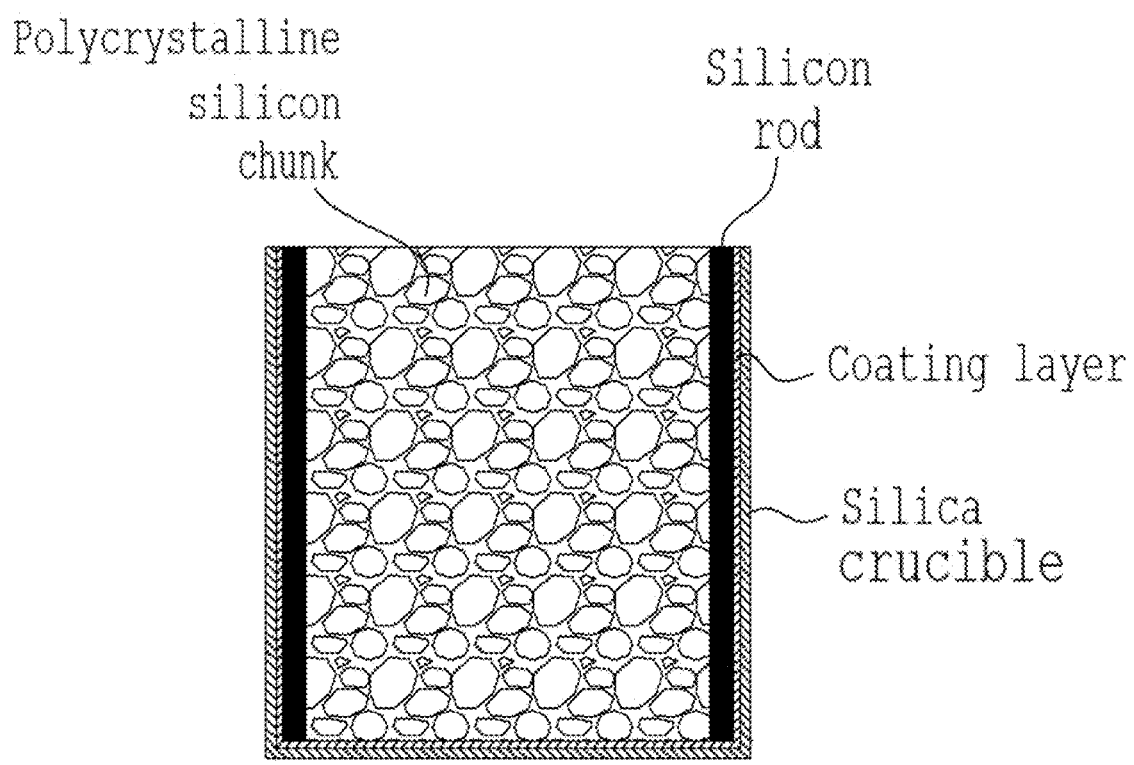
Figure 4C:
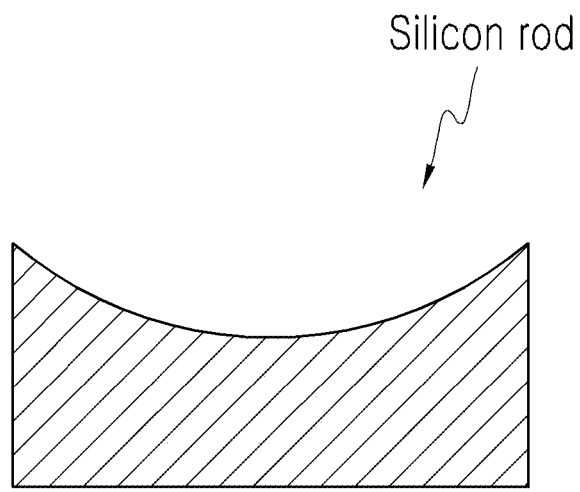
FIG. 4C is a cross sectional view showing the silicon rod shown in FIG. 4A.
Figure 4D:
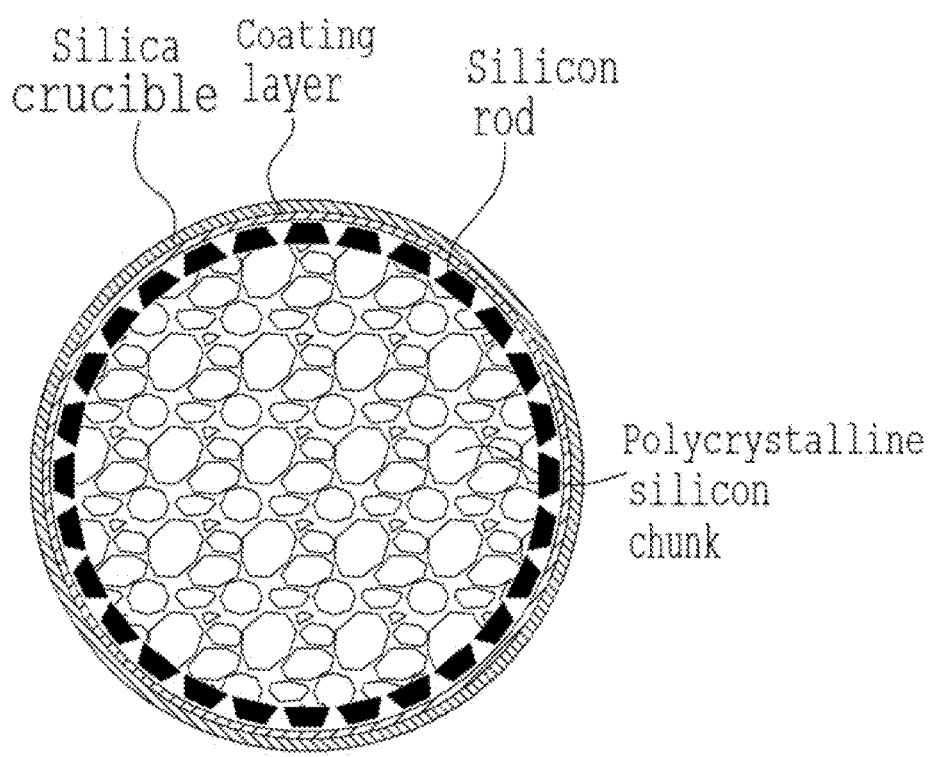
FIG. 4D is a cross sectional view showing a configuration where the single crystal or polycrystalline silicon rods each having the shape of a trapezoidal pillar are located on the inner peripheral surface of the crucible of the polycrystalline silicon ingot manufacturing apparatus according to the present invention.
Figure 4E:
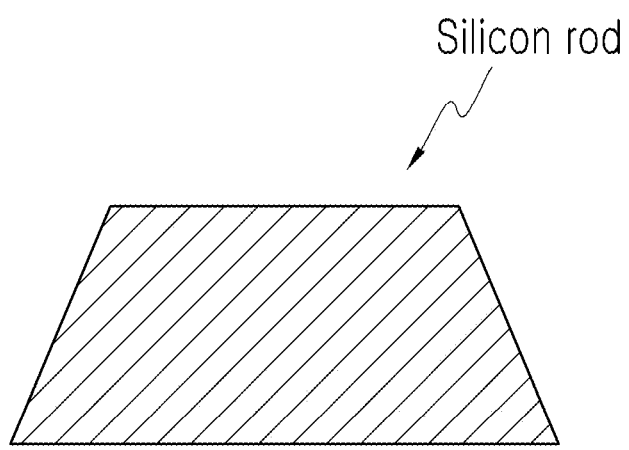
FIG. 4E is a cross sectional view showing the silicon rod shown in FIG. 4D.

In this case, as shown in FIGS. 4A and 4D, the single crystal or polycrystalline quadrilateral pillar-shaped silicon rods stand close to one another along the inner peripheral surface of the crucible 20.

Figure 5A:
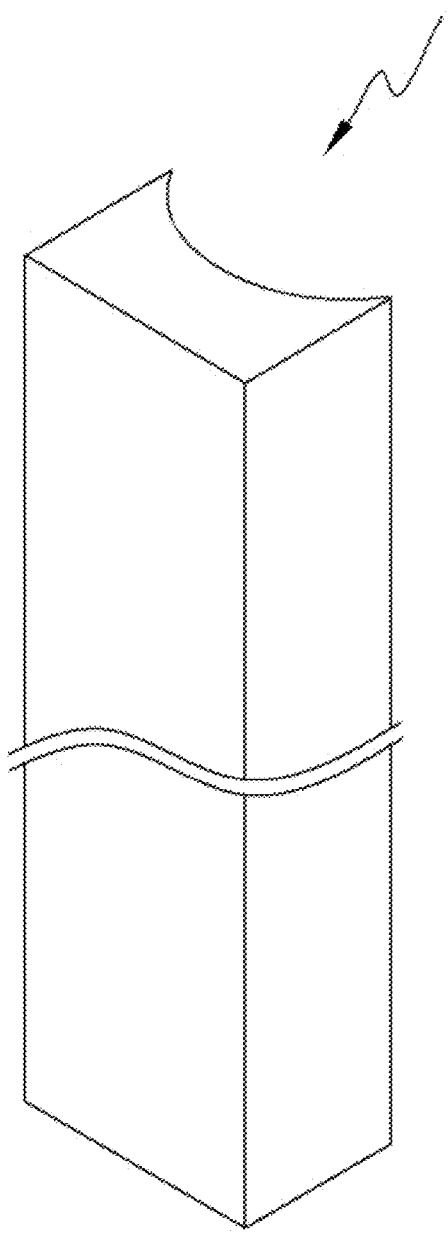
FIGS. 5A and 5B are perspective views respectively showing the silicon rods having the shape of the rectangular pillar with the concave one side and the shape of the trapezoidal pillar according to the present invention.
Figure 5B:
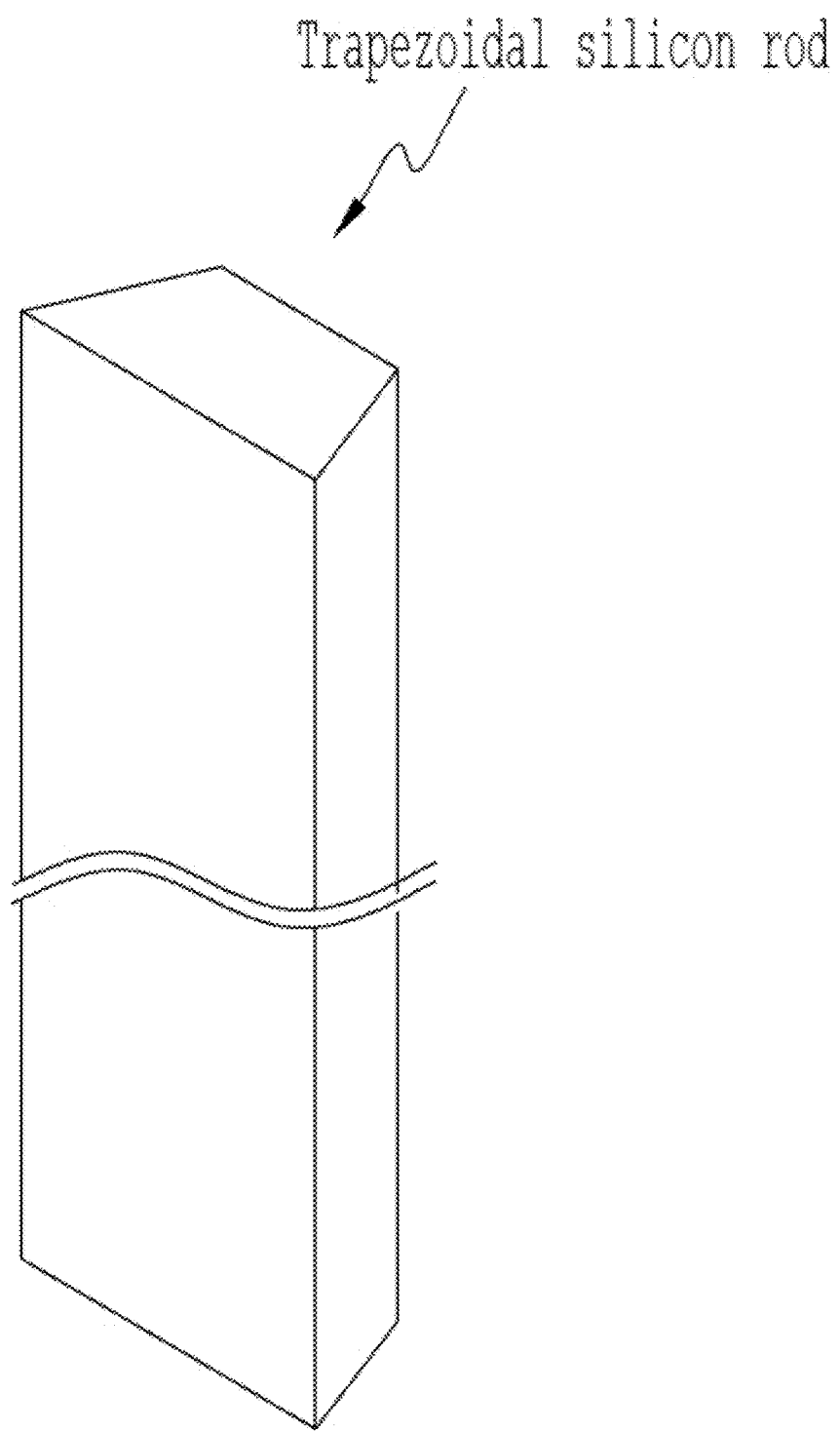

In more detail, the crucible 20 is configured to have the single crystal or polycrystalline silicon rods each having the shape of the trapezoidal pillar (See FIG. 5B) or the shape of the rectangular pillar with the concave one side (See FIG. 5A) arranged close to one another along the inner peripheral surface thereof.

In the case of the single crystal or polycrystalline quadrilateral pillar-shaped silicon rods each having the shape of the trapezoidal pillar (See FIG. 5B), the short side of the trapezoid is oriented toward the inner peripheral surface of the crucible 20 (See FIG. 4D), and in the case of the single crystal or polycrystalline silicon rods each having the shape of the rectangular pillar with the concave one side (See FIG. 5A), the concave portion of the rectangular pillar is oriented toward the inner peripheral surface of the crucible 20 (See FIG. 4A).

In a state where the silicon chunks are put into the crucible 20 after the single crystal or polycrystalline quadrilateral pillar-shaped silicon rods have been arranged in the circular crucible 20, it can be appreciated that oxygen exhaust passages may be appropriately formed (See FIGS. 4A, 4B and 4D).

Even in the case where the single crystal or polycrystalline quadrilateral pillar-shaped silicon rods each having the shape of the trapezoidal pillar (See FIGS. 4D, 4E and 5B) or each having the shape of the rectangular pillar with the concave one side (See OF IGS. 4A to 4C and 5A) are arranged in the circular or square crucible, it is obvious that the oxygen exhaust passages are appropriately formed, as mentioned above. Therefore, a detailed explanation of the oxygen exhaust passages will be avoided.

A third step is carried out to put the silicon chunks into the crucible 20.

In specific, the silicon chunks are put into the internal space portion formed by the single crystal or polycrystalline quadrilateral pillar-shaped silicon rods each having the shape of the trapezoidal pillar (See FIG. 4D) or each having the shape of the rectangular pillar with the concave one side (See FIGS. 4A and 4B) arranged in the circular crucible 20 at the second step.

In this case, the silicon chunks put into the crucible 20 are the same as utilized in the polycrystalline silicon ingot manufacturing apparatus known in the art, and therefore, an explanation of the silicon chunks will be omitted.

A fourth step is carried out to melt and crystallize the silicon chunks and the silicon rods.

In specific, the step of melting and crystallizing the silicon chunks is carried out by utilizing the ingot manufacturing method as disclosed in Korean Patent Application Laid-open No. 10-2012-0135284 in a state where the single crystal or polycrystalline quadrilateral pillar-shaped silicon rods and the silicon chunks have been put into the crucible at the third step, and otherwise, the step of melting and crystallizing the silicon chunks is carried out by utilizing the Kyropoulos method (KY method), the Czochralski method (CZ method), the Edge-defined Film-fed Growth (EFG) method, the heat exchange method, the vertical horizontal gradient freezing method, and so on, in which the silicon chunks are molten by means of the underside heater of the silicon ingot manufacturing apparatus utilized in the technical field of the present invention and then crystallized through a series of processes such as temperature control of the underside heater, thereby manufacturing the silicon ingot. Therefore, a detailed explanation of the melting and crystallizing step of the silicon chunks will be avoided.

If the silicon chunks are molten in the crucible 20 in a state where oxygen exhaust passages are not formed inside the crucible 20, the oxygen of the coatings or the oxygen generated from the silica crucible 20 is mixedly introduced into the silicon melt, and the oxygen in the silicon melt is an air bubble-shaped gas that is raised from the bottom of the silicon melt to the top thereof and then exhausted.

If the silicon melt starts to be solidified, it is mixed with the oxygen generated from the coatings formed on the bottom and the side of the silica crucible upon the unidirectional growth to the polycrystalline silicon ingot, and accordingly, the amount of oxygen in the silicon melt becomes increased.

Further, the impurities inside the silicon melt are pushed to the outside according to the crystal growth characteristics of silicon, and accordingly, oxygen is collectively mixedly introduced to the bottom and side of the crucible.

In the case of the polycrystalline silicon ingot manufacturing method through which the oxygen exhaust passages are formed in the crucible by means of the single crystal or polycrystalline silicon rods, however, the oxygen generated from the bottom and side of the crucible can be exhausted above the crucible through the oxygen exhaust passages formed between the single crystal or polycrystalline silicon rods and the inner peripheral wall of the crucible.

As a result, the polycrystalline silicon ingot can be prevented from being mixed with oxygen, thereby being suppressed from being broken or forming the concave grooves on the surface thereof.

To determine the effectiveness in suppressing the ingot breakage and the concave groove formation on the surface of the ingot, test results performed by the inventor of the present invention are as follows.

First, the test conditions are made with the same material, the same processing, and the same manufacturing apparatus, and a manufacturing method of a prior art does not have any oxygen exhaust passages with the polycrystalline silicon rods.

Figure 6:
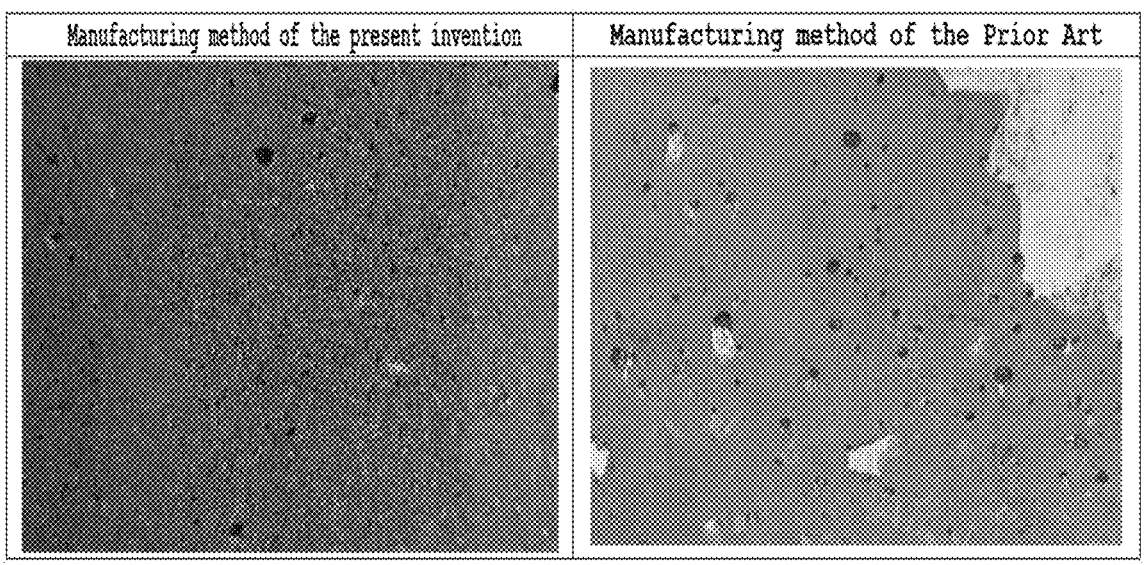
FIG. 6 is a photograph showing a sectional view of polycrystalline silicon ingot specimens produced by manufacturing method of the present invention and manufacturing method of the Prior Art.

As shown in the FIG. 6, it can be appreciated that the silicon ingot manufactured according to the present invention has a smaller number of air bubbles and smaller air bubble sizes than the manufacturing method of the prior art.

As described above, the method for manufacturing the polycrystalline silicon ingot according to the present invention can gently emit the oxygen generated from the bottom and side of the crucible in an upward direction from the crucible through the oxygen exhaust passages formed between the polycrystalline silicon rods and the inner peripheral wall of the crucible in the process of the polycrystalline silicon crystallization, thereby minimizing the partial breakage of the ingot and the formation of concave air bubble exhaust grooves with various sizes on the surface of the ingot.

The embodiments of the present invention have been disclosed in the specification and drawings. In the description of the present invention, special terms are used not to limit the present invention and the scope of the present invention as defined in claims, but just to explain the present invention. Therefore, persons skilled in the relevant art can appreciate that many modifications and variations are possible in light of the above teachings. It is therefore intended that the scope of the invention be limited not by this detailed description, but rather by the claims appended hereto.

What is claimed is:

1. A method of manufacturing polycrystalline silicon ingot using a crucible in which an oxygen exhaust passage is formed by single crystal or polycrystalline rods, the method comprising the steps of:

manufacturing the single crystal or polycrystalline silicon rods each having the shape of a quadrilateral pillar;

putting the single crystal or polycrystalline quadrilateral pillar-shaped silicon rods into the crucible having circular horizontal sectional shape in such a manner as to be arranged close to one another along the inner peripheral surface of the crucible to thus form a space portion inside the single crystal or polycrystalline silicon rods, into which silicon chunks are put, and the oxygen exhaust passages between the inner peripheral surface of the crucible and the respective surfaces of the single crystal or polycrystalline silicon rods oriented toward the inner peripheral surface of the crucible;

putting the silicon chunks into the space portion of the crucible; and melting and crystallizing the silicon chunks and the silicon rods, wherein the single crystal or polycrystalline silicon rods are pillars each having the shape of a rectangular pillar with a concave one side, and the concave portion of the rectangular pillar is oriented toward the inner peripheral surface of the crucible.

\* \* \* \* \*